United States Patent [19]

Kirchgessner

[11] Patent Number: 5,134,082

[45] Date of Patent: Jul. 28, 1992

[54] METHOD OF FABRICATING A SEMICONDUCTOR STRUCTURE HAVING MOS AND BIPOLAR DEVICES

[75] Inventor: James A. Kirchgessner, Tempe, Ariz.

[73] Assignee: Motorola, Inc., Schaumburg, Ill.

[21] Appl. No.: 712,776

[22] Filed: Jun. 10, 1991

[51] Int. Cl.$^5$ .......................................... H01L 21/265
[52] U.S. Cl. ....................................... 437/31; 437/33; 437/57; 437/41; 148/DIG. 9
[58] Field of Search ..................... 437/33, 31, 34, 41, 437/57, 59, 38; 148/DIG. 9

[56] References Cited

U.S. PATENT DOCUMENTS

| | | | |
|---|---|---|---|
| 4,707,456 | 11/1987 | Thomas et al. | 437/41 |
| 4,803,175 | 2/1989 | Alvarez et al. | 437/31 |
| 4,808,548 | 2/1989 | Thomas et al. | 148/DIG. 9 |
| 4,830,973 | 5/1989 | Mastroianni | 437/31 |
| 4,837,176 | 6/1989 | Zdebel et al. | 437/31 |
| 4,902,639 | 2/1990 | Ford | 437/31 |
| 4,960,726 | 10/1990 | Lechaton et al. | 437/33 |
| 4,987,089 | 1/1991 | Roberts | 148/DIG. 9 |
| 5,008,210 | 4/1991 | Chiang et al. | 437/33 |
| 5,034,338 | 7/1991 | Neppl et al. | 437/33 |
| 5,037,768 | 8/1991 | Cosentino | 437/31 |
| 5,079,177 | 1/1992 | Lage et al. | 437/59 |
| 5,096,843 | 3/1992 | Kodaira | 437/33 |

OTHER PUBLICATIONS

Huang et al. "A High-Speed Bipolar Technology Featuring Self-Aligned Single-Poly Base and Submicrometer Emitter Contacts" *IEEE Electron Device Letters* vol. 11, #9 Sep. 79, pp. 402-404.

Ikeda et al., "Advanced BiCMOS Technology for High Speed VLSI", *IEDM* 86, pp. 408-411.

El-Diwany et al. "An Advanced BiCMOS Process Utilizing Ultra-Thin Silicon Epitaxy Over Arsenic Layers", *IEDM* 89 pp. 245-248.

de Jong et al. "Single Polysilicon Layer Advanced Super High-Speed BiCMOS Technology" *IEEE* 1989 pp. 182-185.

Kobayashi et al. "High Performance LSI Process Technology: SST CBiCMOS" *IEDM* 98 pp. 760-763.

Yuzuriha et al. "Submicron Bipolar-CMOS Technology Using 16 Ghz for Double Poly-SI Bipolar Devices", *IEDM* 88 pp. 748-751.

*Primary Examiner*—Brian E. Hearn
*Assistant Examiner*—Kevin Picardat
*Attorney, Agent, or Firm*—Harry A. Wolin

[57] ABSTRACT

A method of fabricating a semiconductor structure having MOS and bipolar devices includes providing an isolation structure having MOS and bipolar active areas including doped wells. A collector region is formed in the bipolar active area well and a first semiconductor layer is then formed over the MOS and bipolar active areas. An active base region is formed in the bipolar active area well and a dielectric layer is formed on the first semiconductor layer over a portion of the bipolar active area. A window is formed through the dielectric layer and extends to the first semiconductor layer. A second semiconductor layer is then formed over the MOS and bipolar active areas. A gate electrode is formed on the MOS active area and emitter and collector electrodes are formed on the bipolar active area. The gate, emitter and collector electrodes are formed from both the first and second semiconductor layers and the emitter electrode extends into the window. After doping the emitter and collector electrodes, self-aligned source and drain regions are diffused into the MOS active area and an emitter region is diffused into the bipolar active area from the emitter electrode through the window.

15 Claims, 11 Drawing Sheets

METHOD OF FABRICATING A SEMICONDUCTOR STRUCTURE HAVING MOS AND BIPOLAR DEVICES

FIELD OF THE INVENTION

This invention relates, in general, to the semiconductor arts and more particularly to a method of fabricating a semiconductor structure having MOS and bipolar devices.

BACKGROUND OF THE INVENTION

Semiconductor technology employing both MOS and bipolar devices is extremely desirable because it allows for integrated circuits having the most attractive features of each technology. For example, BICMOS integrated circuits have high performance in terms of speed and current drive capability due to the use of bipolar devices while the use of CMOS devices allows the same circuit to also have high density and low power consumption features.

There have been many problems associated with the integration of bipolar and CMOS devices into a single circuit. It is generally impractical to fabricate CMOS devices in a traditionally bipolar structure and vice versa. As a result, the processes employed for fabricating BICMOS integrated circuits are often extremely complicated. In addition to process complexity, the result of many prior art BICMOS processes is the limited performance of bipolar devices due to sacrifices made to integrate the various technologies. A major reason for having bipolar devices in an integrated circuit is for high performance. Accordingly, the performance of bipolar devices in a BICMOS integrated circuit should not be sacrificed. Finally, many existing BICMOS integrated circuits require extremely large amounts of real estate. This is undesirable.

Accordingly, it would be highly desirable to have a method for fabricating semiconductor structures having MOS and bipolar devices that has process integration flexibility, enhanced scalability characteristics and does not sacrifice performance of the bipolar devices.

SUMMARY OF THE INVENTION

A method of fabricating a semiconductor structure having MOS and bipolar devices includes providing an isolation structure having MOS and bipolar active areas including doped wells. Initially a collector region is formed in the bipolar active area well and a first semiconductor layer is then formed over the MOS and bipolar active areas. Following the formation of an active base region in the bipolar active area well, a dielectric layer is formed on the first semiconductor layer over a portion of the bipolar active area. A window extending to the first semiconductor layer is formed through the dielectric layer. A second semiconductor layer is formed over the MOS and bipolar active areas. A gate electrode is formed on the MOS active area and emitter and collector electrodes are formed on the bipolar active area. The gate, emitter and collector electrodes are formed from the first and second semiconductor layers. After doping the emitter and collector electrodes, an emitter is diffused into the bipolar active area from the doped emitter electrode through the window. Self-aligned source and drain regions are then formed in the MOS active area.

BRIEF DESCRIPTION OF THE DRAWINGS

FIGS. 1-5 are highly enlarged cross-sectional views of a semiconductor structure during processing wherein FIGS. 1A-5A represent a MOS portion of the structure and FIGS. 1B-5B represent a bipolar portion, the portions of the structure shown in these FIGS. representing an isolation module;

FIGS. 6-10 are highly enlarged cross-sectional views of a BICMOS semiconductor structure during processing in accordance with the present invention wherein FIGS. 6A-10A represent the MOS portion of the structure and FIGS. 6B-10B represent the bipolar portion; and FIG. 11 is a highly enlarged cross-sectional view of BICMOS semiconductor structure in accordance with the present invention wherein FIG. 11A represents the MOS portion of the structure and FIG. 11B represents the bipolar portion.

DETAILED DESCRIPTION OF THE PREFERRED EMBODIMENT

FIGS. 1-5 are highly enlarged cross-sectional views of a semiconductor structure 10 during processing wherein FIGS. 1A-5A represent a MOS portion 12 of structure 10 and FIGS. 1B-6B represent a bipolar portion 14 of structure 10. The portions shown in FIGS. 1-5 representing an isolation module. Although specific materials, conductivity types, thicknesses and other parameters are set forth herein, it should be understood that these are not meant to be limiting and only serve to show a preferred embodiment of the present invention.

Figure 1A:
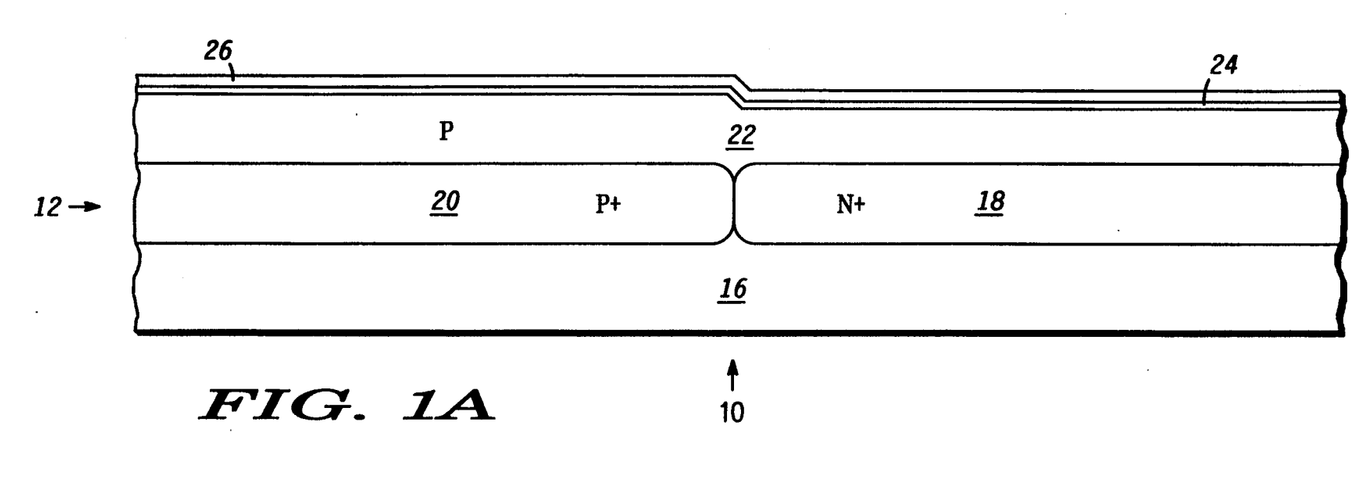
Figure 1B:
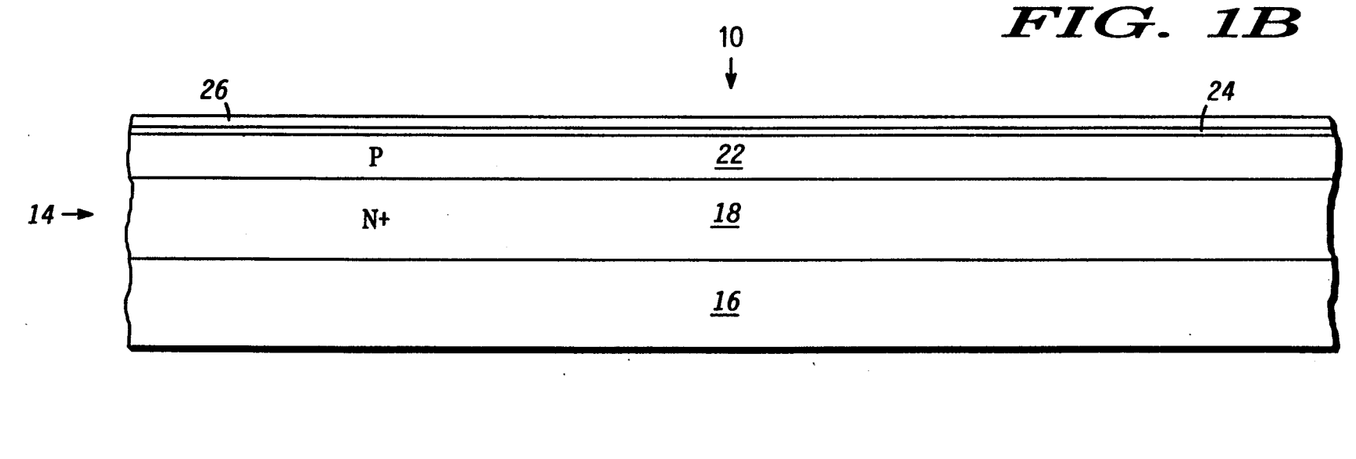

Initially, a substrate 16 is provided. Substrate 16 comprises single crystal silicon of a <100> crystallographic orientation. Substrate 16 is of a P conductivity type and has a resistivity on the order of 6 to 8 ohm centimeters. A screen oxide layer (not shown) is formed on substrate 16. The screen oxide layer is thermally grown and has a thickness on the order of 200 angstroms. The screen oxide layer serves to protect the surface of substrate 16 from contamination.

An N+ buried layer 18 is formed in substrate 16. N+ buried layer 18 is formed by implanting arsenic or another N type dopant into substrate 16. Buried layer 18 is implanted throughout entire bipolar portion 14 and the portion of MOS portion 12 where a P channel MOS transistor is to fabricated. Once buried layer 18 has been implanted, it is annealed to obtain the desired dopant profile. As disclosed herein, N+ buried layer 18 has a surface dopant concentration on the order of $10^{19}$ atoms/cc.

Simultaneously with the anneal of buried layer 18, additional oxide is grown on the screen oxide layer. The thickness of the screen oxide layer becomes on the order of 3000 to 4000 angstroms over buried layer 18. The screen oxide layer will not grow as fast where not disposed over buried layer 18. Therefore, the portion of the screen oxide layer disposed over the portion of MOS portion 12 not including buried layer 18 will have a thickness on the order of 500 to 600 angstroms.

A P+ buried layer 20 is formed in the portion of MOS portion 12 where buried layer 18 was not formed. P+ buried layer 20 is formed in the portion of MOS portion 12 where an N-channel MOS transistor is to be formed. Buried layer 20 is formed by implanting boron or another P type dopant into substrate 16. After implanting buried layer 20, it is annealed. As shown herein, buried layer 20 has a surface dopant concentration on the order of $10^{17}$ to $10^{18}$ atoms/cc.

Following the formation of buried layers 18 and 20, the entire screen oxide layer is removed to expose substrate 16. The screen oxide layer may be removed with a wet etch employing HF chemistry. Once the screen oxide layer has been completely removed and substrate 16 exposed, an epitaxial layer 22 is formed on substrate 16. Epitaxial layer 22 is formed by methods well known in the art. Epitaxial layer 22 is lightly doped P-type having a dopant concentration on the order of $10^{15}$ to $10^{16}$ atoms/cc and may be in situ doped. The thickness of epitaxial layer 22 is on the order of 1.6 micrometers.

A well oxide layer 24 is formed on epitaxial layer 22. Well oxide layer 24 has a thickness on the order 500 angstroms and may be thermally grown or deposited. A well nitride layer 26 is then deposited on well oxide layer 24. Well nitride layer 26 has a thickness on the order of 1400 angstroms. As shown, epitaxial layer 22, well oxide layer 24 and well nitride layer 26 all are conformally formed over the entire surface of MOS portion 12 and bipolar portion 14.

Figure 2A:
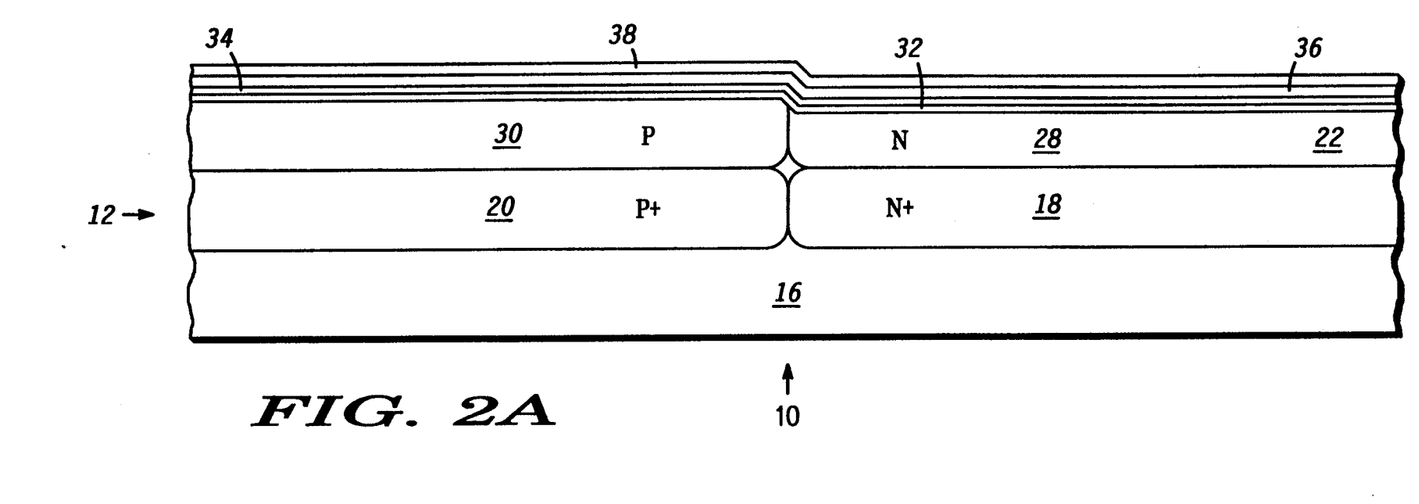
Figure 2B:
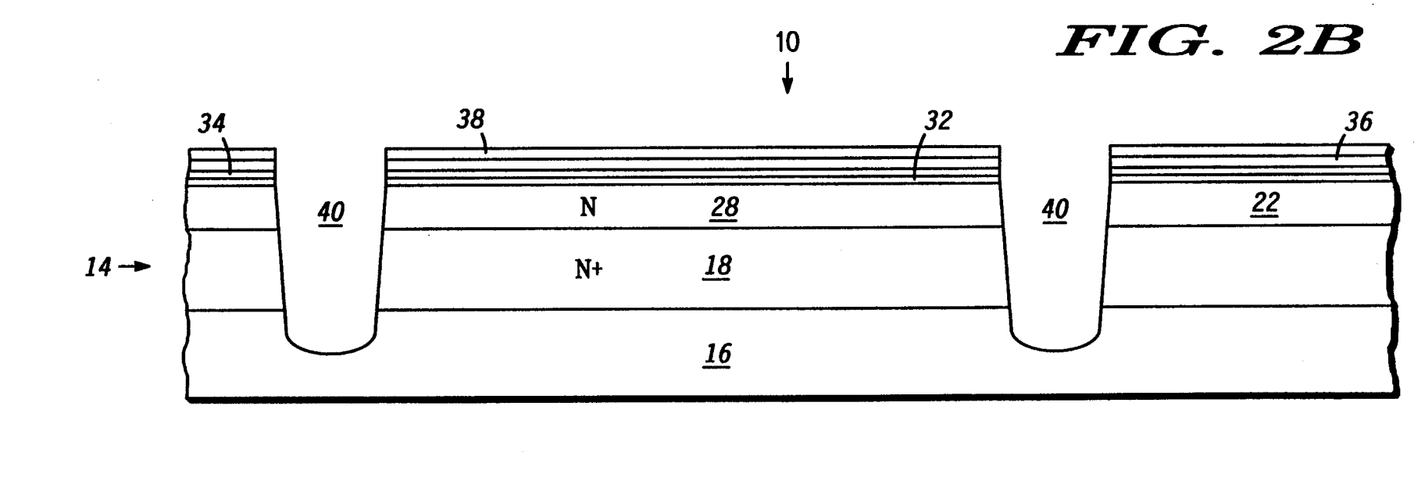

Now referring specifically to FIGS. 2A and 2B. The portions of well nitride layer 26 (see FIG. 1) disposed over N+ buried layer 18 are removed, preferably by reactive ion etching (RIE). At this point, well nitride layer 26 remains disposed over P+ buried layer 20. Phosphorous or another N type dopant is implanted into the portions of epitaxial layer 22 above buried layer 18. The implant is then annealed to form N wells 28 in MOS portion 12 and bipolar portion 14. Simultaneous with the anneal of N wells 28, the portions of well oxide layer 24 (see FIG. 1) disposed above N wells 28 is further thermally oxidized to a thickness on the order of 3000-4000 angstroms.

Following the oxidation and anneal step, the remaining portion of well nitride layer 26 disposed over P+ buried layer 20 is removed. An etch that will selectively remove well nitride layer 26 without significantly etching well oxide layer 24 disposed therebeneath is employed. Once this portion of well nitride layer 26 has been removed, boron or another P type dopant is implanted into epitaxial layer 22 above buried layer 20. The increased thickness of well oxide layer 24 over N wells 28 is sufficient to prohibit the P type dopant from significantly entering N wells 28. Following the implant of the P type dopant, structure 10 is annealed to form P well 30 over buried layer 20 in MOS portion 12. Following the formation of P well 30, well oxide layer 24 is completely removed from the surface of epitaxial layer 22 in which P wells 28 and N well 30 have been formed.

Following the removal of well oxide layer 24, a pad oxide layer 32 is formed on the surface of epitaxial layer 22. Pad oxide layer 32 has a thickness on the order of 150 angstroms and may be formed by thermally oxidizing epitaxial layer 22. A polysilicon layer 34 is formed on pad oxide layer 32. Polysilicon layer 34 is deposited and has a thickness on the order of 500 angstroms. A nitride layer 36 is deposited on polysilicon layer 34. Nitride layer 36 has a thickness on the order of 1500 angstroms. An oxide layer 38 is formed on nitride layer 36. Oxide layer 38 has a thickness on the order of 2600 angstroms and may be formed by well known processes such as a TEOS oxide deposition process.

Isolation trenches 40 are formed in bipolar portion 14 through buried layer 18. Preferably, trenches 40 are formed by forming openings in a photoresist layer (not shown) above the regions where trenches 40 are to be formed and first etching through oxide layer 38 and nitride layer 36. This is preferably done by RIE. Once this has been performed, an RIE etch is performed through polysilicon layer 34, pad oxide layer 32, epitaxial silicon 22 and into substrate 16 beneath buried layer 18.

Figure 3A:
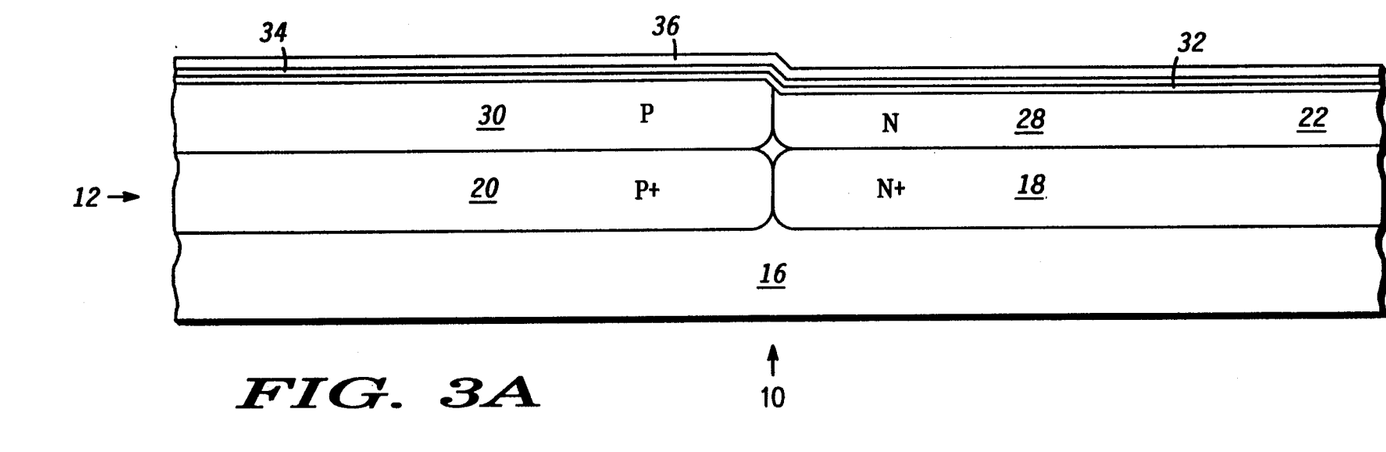
Figure 3B:
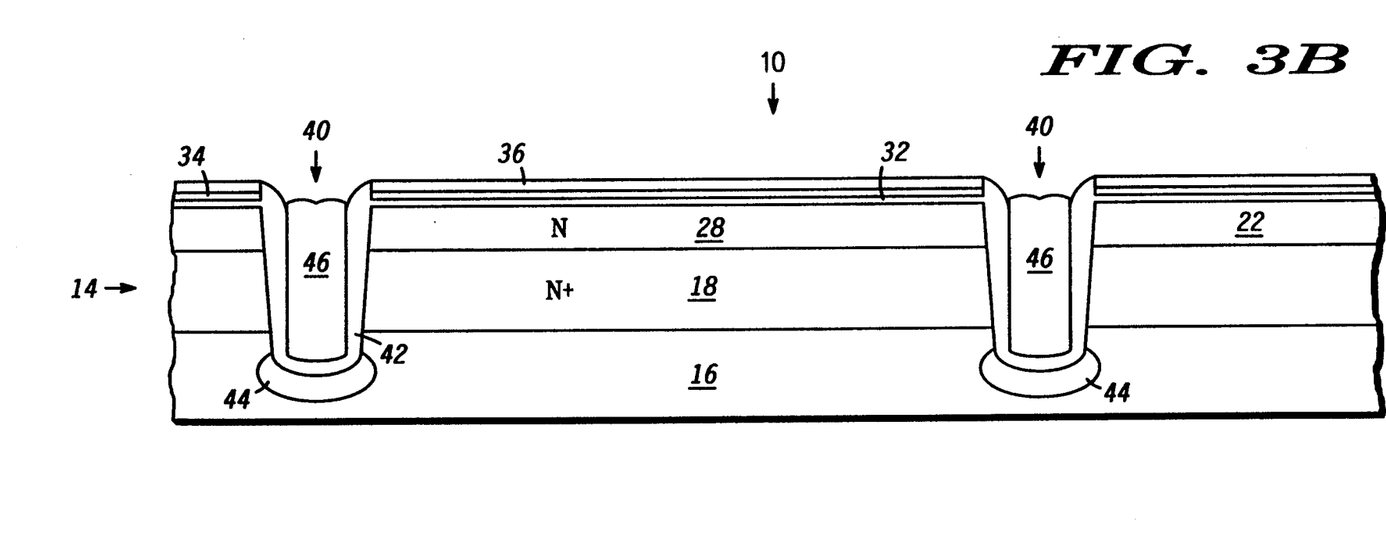

Now referring to specifically to FIGS. 3A and 3B. After removing oxide layer 38 and cleaning trenches 40, a trench liner oxide 42 is formed in trenches 40. Initially, trench liner oxide 42 has a thickness on the order of 400 angstroms. Once trench liner oxide 42 has been formed, channel stops 44 are formed. As shown herein, channel stops 44 are formed by implanting boron or another P type dopant into substrate 16 below trenches 40. Following the channel stop implant, additional oxide is formed on trench liner oxide 42 to give it a thickness on the order of 2600 angstroms. It should be understood that in addition to this additional oxide being formed in trenches 40, it is also formed conformally (not shown) on the surfaces of bipolar portion 14 and MOS portion 12.

Trench fill polysilicon 46 is formed in trenches 40. Trench fill polysilicon 46 is also formed conformally on the surface of bipolar portion 14 and MOS portion 12. A spin-on glass is applied over the surface of bipolar portion 14 and MOS portion 12. The spin-on glass serves to planarize the surfaces. The spin-on glass and the portions of trench fill polysilicon 46 not disposed in the trenches are etched back by RIE until the conformal trench liner oxide 42 is exposed. Trench fill polysilicon 46 is etched back in trenches 40 so that trench fill polysilicon 46 is recessed from the top of trench 40. Once trench fill polysilicon has been etched back, the portions of trench liner oxide 42 not disposed in the trenches are removed. This is preferably done by RIE.

Figure 4A:
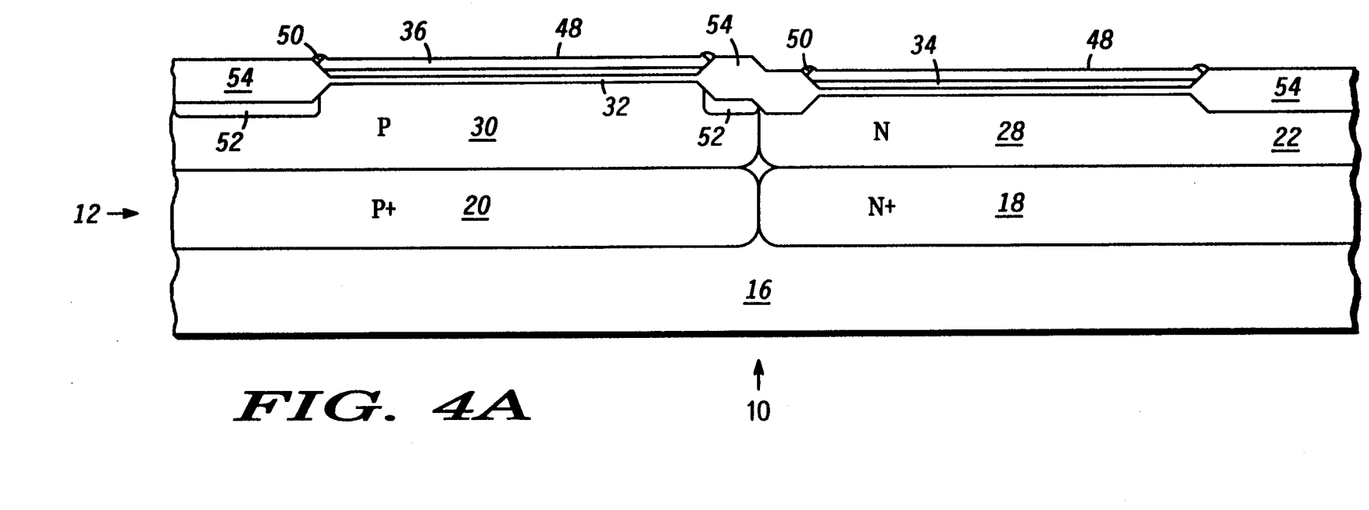
Figure 4B:
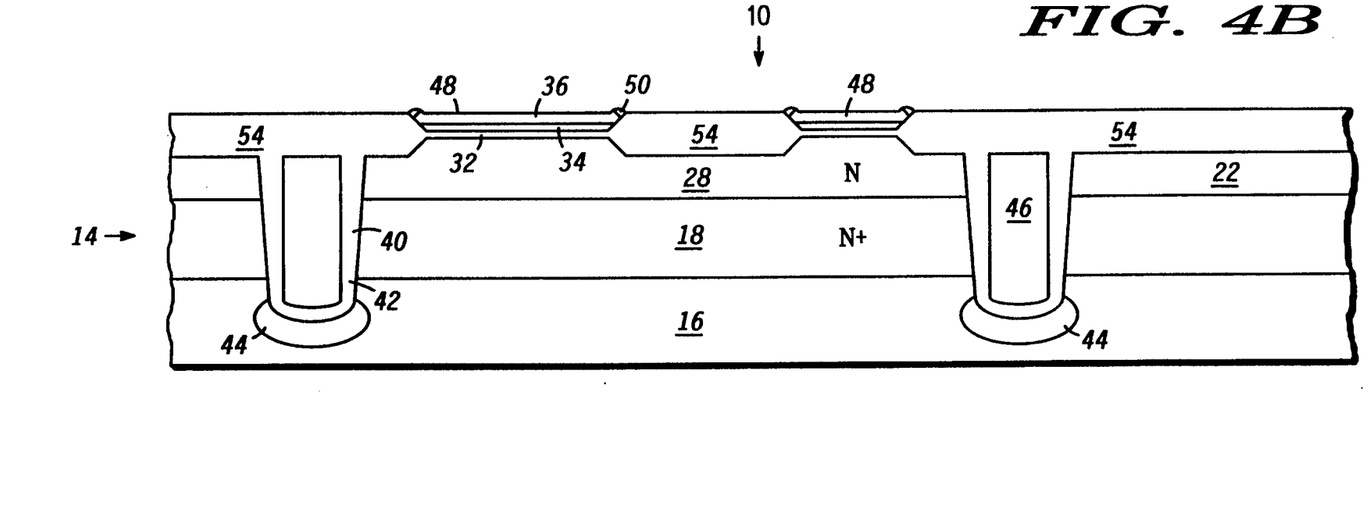

Now referring specifically to FIGS. 4A and 4B. Once trench liner oxide 42 has been removed from the surface of MOS portion 12 and bipolar portion 14 to expose nitride layer 36, portions of nitride layer 36 are removed so that only nitride portions 48 remain. Nitride spacers 50 are then formed on the ends of nitride portions 48. Nitride spacers 50 are formed by depositing a conformal nitride layer (not shown) over the surfaces of MOS portion 12 and bipolar portion 14 and then anisotropically reactive ion etching the conformal nitride layer to form nitride spacers 50.

Following the formation of spacers 50, field regions 52 are implanted into P well 30 to control inversion-beneath field oxide regions 54. The implant of field regions 52 is self-aligned to nitride portion 48 and nitride spacers 50 disposed above P well 30. To form field regions 52, boron or another P type dopant is implanted. Field regions 52 have a dopant concentration on the order of $10^{17}$ atoms/cc. The exposed portions of polysilicon layer 34 (those not disposed beneath nitride portions 48) are oxidized to form field oxide regions 54. Field oxide regions 54 have a thickness on the order 6000 to 7000 angstroms. It should be understood that field regions 52 are annealed during the formation of field oxide regions 54.

Figure 5A:
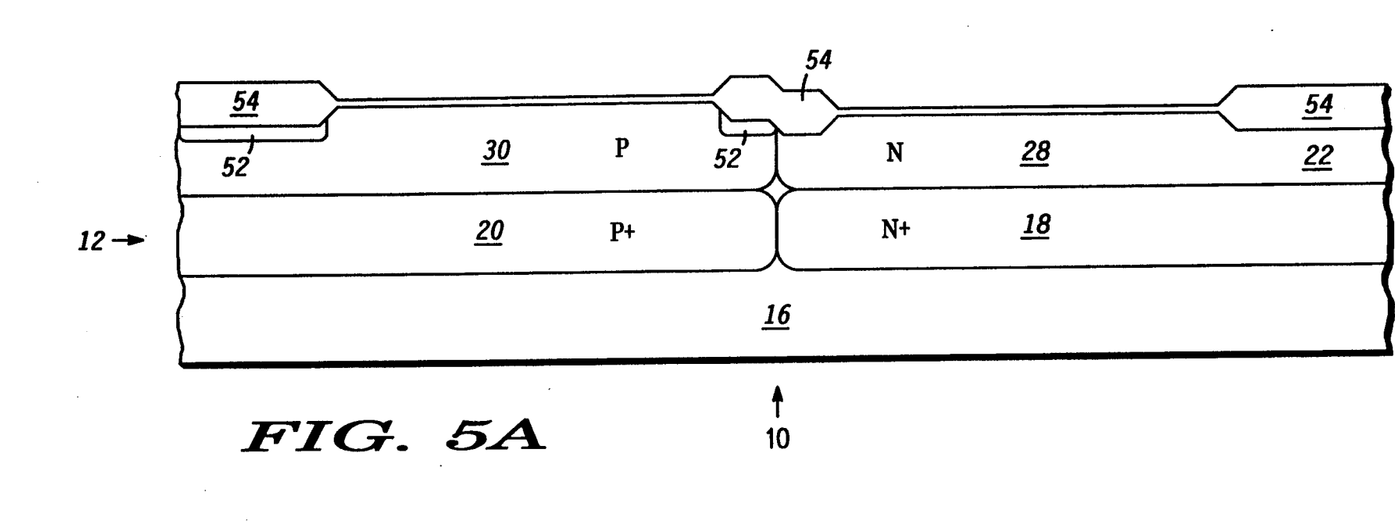
Figure 5B:
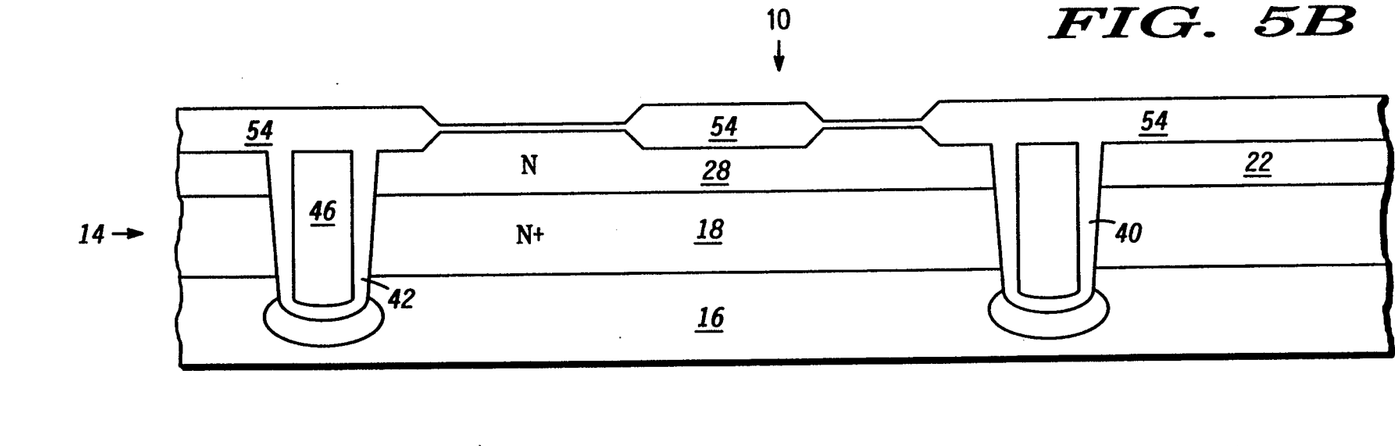

Following the formation of field oxide regions 54, nitride portions 48 and nitride spacers 50 are removed. Once nitride portions 48 and nitride spacers 50 have been removed, the isolation module of structure 10 as depicted by FIGS. 5A and 5B is complete. Although a specific isolation module 10 is depicted herein, it should be understood that the present invention may be employed with many different isolation modules.

Once the isolation module depicted by FIGS. 5A and 5B has been fabricated, the actual fabrication of the bipolar and MOS devices begins. FIGS. 6-10 are highly enlarged cross-sectional views of BICMOS semiconductor structure 10 during device processing in accordance with present invention wherein FIGS. 6A-10A represent MOS portion 12 of structure 10 and FIGS. 6B-10B represent bipolar portion 14. Now referring specifically to FIGS. 6A and 6B. A collector region 56 is implanted into N well 28 of bipolar portion 14. Collector region 56 has an N+ conductivity type herein and a dopant concentration in the range of $10^{18}$ to $10^{19}$ atoms/cc. Very high dopant concentrations are preferred for collector region 56 although defect problems caused by the implant must be minimized. Although a separate implanted collector region 56 is shown and described herein, it should be understood that N well 28 itself, without an additional implanted region, may serve as a collector.

Figure 6A:
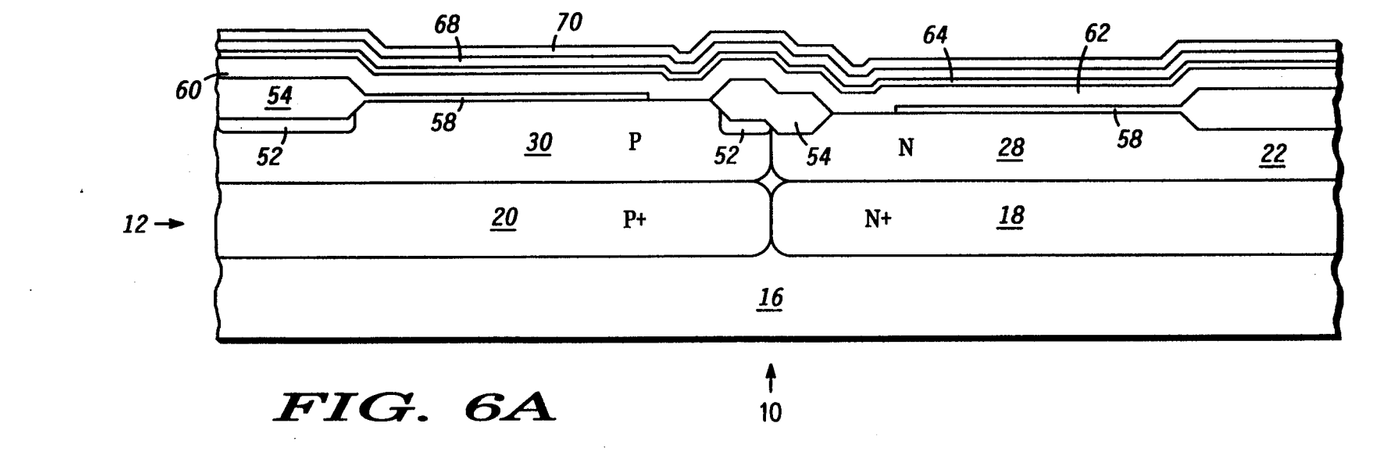
Figure 6B:
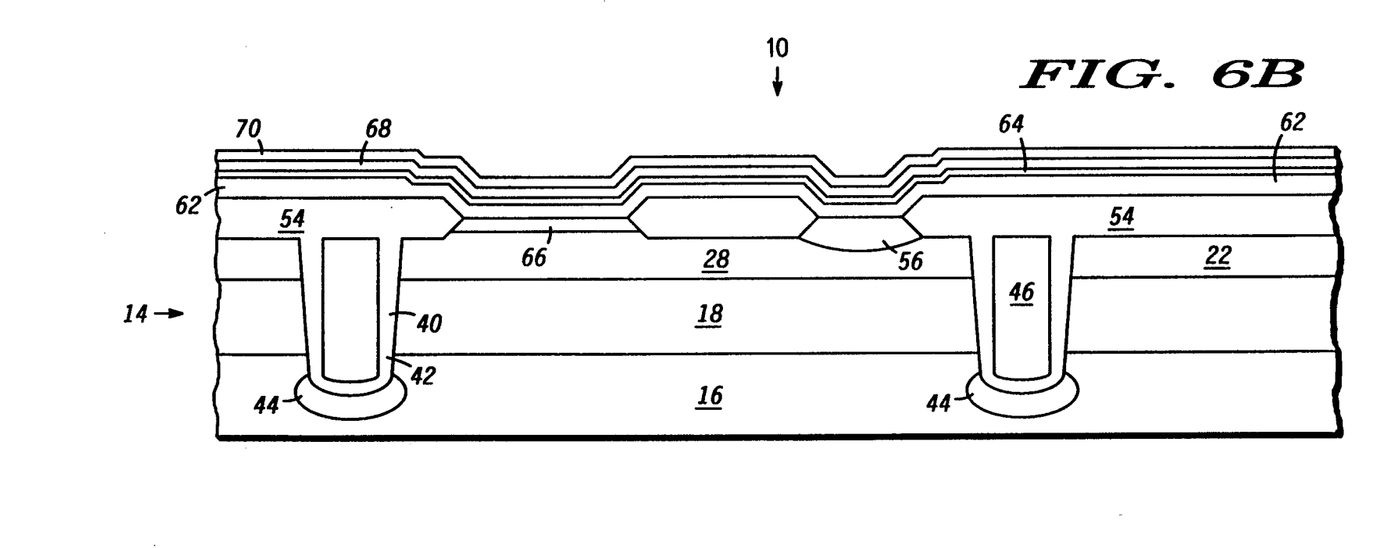

A gate oxide layer 58 is formed over N well 28 and P well 30 of MOS portion 12. Gate oxide layer 58 has a thickness on the order of 100 angstroms and is thermally grown although it could be deposited by methods well known in the art. A gate protection polysilicon layer 60 (shown as a portion of polysilicon layer 62) is formed on gate oxide layer 58. Polysilicon layer 60 has a thickness of approximately 500 angstroms and serves to protect gate oxide layer 58 during future processing. Both gate oxide layer 58 and polysilicon layer 60 are formed over the entire surface of BICMOS structure 10. Threshold and punch-through implants are performed into N well 28 and P well 30 of MOS portion 12. A P-type dopant such as boron is implanted in P well 30 while an N type dopant such as phosphorous is implanted into N well 28. Either single or multiple implants may be implanted into each well 28 and 30 of MOS portion 12. These implants serve to control the threshold of the device and prevent punch-through.

Following the threshold and punch-through implants, portions of gate oxide layer 58 and polysilicon layer 60 are removed by methods well known in the art. On bipolar portion 14, gate oxide layer 58 and polysilicon layer 60 are completely removed from above N well 28 between isolation trenches 40. The portions of gate oxide layer 58 and polysilicon layer 60 are selectively removed where wells 28 and 30 are to be contacted by first electrode polysilicon 62 (to be explained presently).

A first electrode polysilicon layer 62 is formed conformally over entire BICMOS structure 10. First electrode polysilicon 62 is formed by methods well known in the art and has a thickness on the order of 2000 angstroms. First electrode polysilicon layer 62 is undoped at deposition. Following the deposition of first electrode polysilicon 62, a screen oxide layer 64 is formed over the entire surface of BICMOS structure 10. Screen oxide layer 64 is thermally grown and has a thickness on the order of 100 angstroms.

An active base 66 is formed in N well 28 of bipolar portion 14. A P type dopant such as boron or boron difluoride is implanted into a portion of first electrode polysilicon layer 62. Structure 10 is then annealed so that the dopant is driven from the portion of first electrode polysilicon layer 62 into N well 28 to form active base 66. Active base 66 is, of course, P type and has a peak dopant concentration on the order of $10^{19}$ atoms/cc. Following the formation of active base 66, a nitride layer 68 and a polysilicon layer 70 are formed over the surface of BICMOS structure 10. As shown in FIGS. 6A and 6B, both nitride layer 68 and polysilicon layer 70 are formed conformally. It should also be understood that additional layers may be formed on polysilicon layer 70 for desired purposes.

Figure 7A:
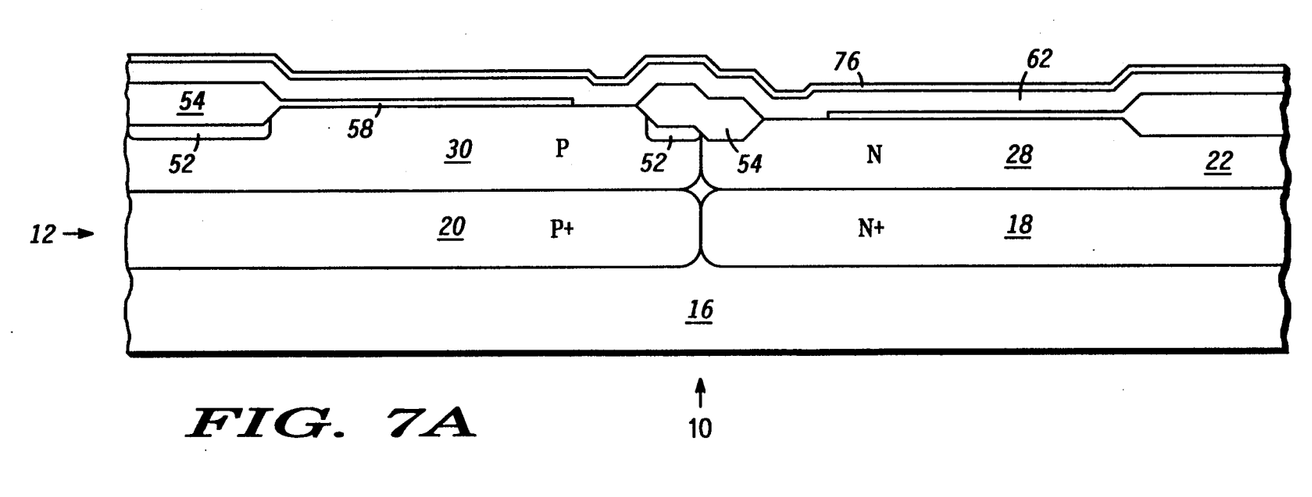
Figure 7B:
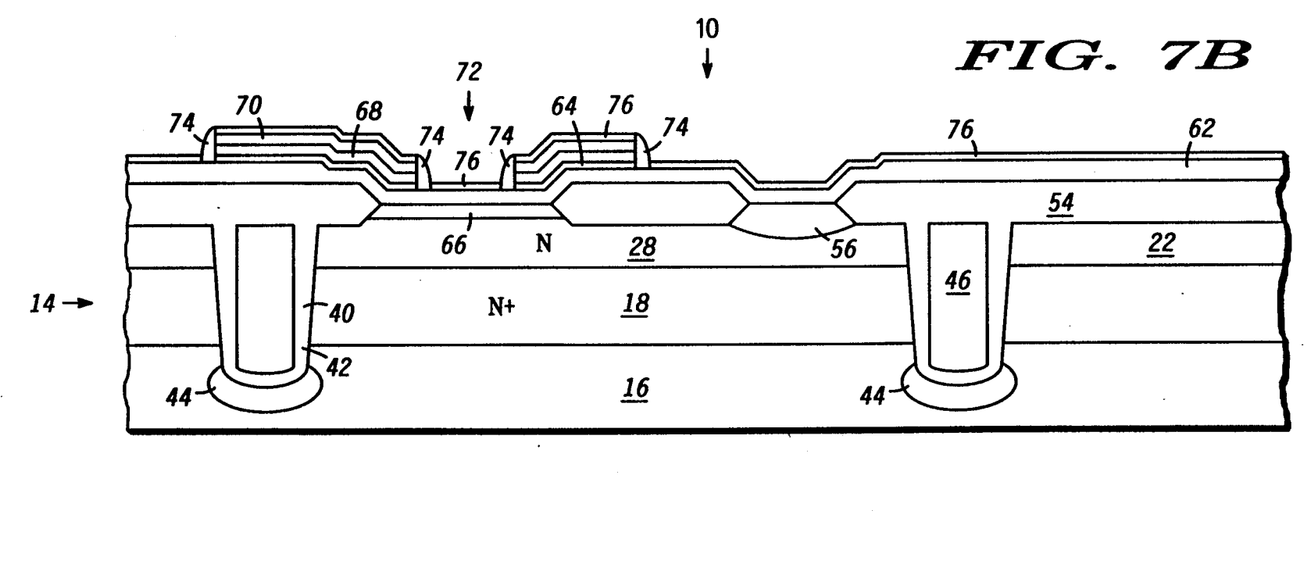

Now referring specifically to FIGS. 7A and 7B. Screen oxide layer 64, nitride layer 68 and polysilicon 70 are patterned and etched so that they are disposed only above N well 28 of bipolar portion 14 away from collector region 56. A window 72 is formed through the remaining portions of screen oxide layer 64, nitride layer 68 and polysilicon layer 70. Window 72 will later serve to define an emitter region. The remaining portions screen oxide layer 64, nitride layer 68 and polysilicon layer 70 will serve to later define the base electrode.

Nitride spacers 74 are formed at the ends of the remaining portions of screen oxide layer 64, nitride layer 68 and polysilicon layer 70 including in window 72. Nitride spacers 74 are formed by depositing a conformal nitride layer over BICMOS structure 10 and then reactive ion etching the conformal nitride layer to form spacers 74. The distance between spacers 74 in window 72 may be less than is readily obtainable using well known lithographic methods. Preferably, this distance is on the order of 0.4 micrometers. A lens oxide layer 76 is formed on all exposed polysilicon of MOS portion 12 and bipolar portion 14 of BICMOS structure 10. This includes formation on the exposed portions of first electrode polysilicon layer 62 and also on the exposed portions of polysilicon layer 70. A portion of lens oxide layer 76 is disposed in window 72 between spacers 74. Lens oxide layer 76 is thermally grown and is on the order of 600 angstroms thick.

Figure 8A:
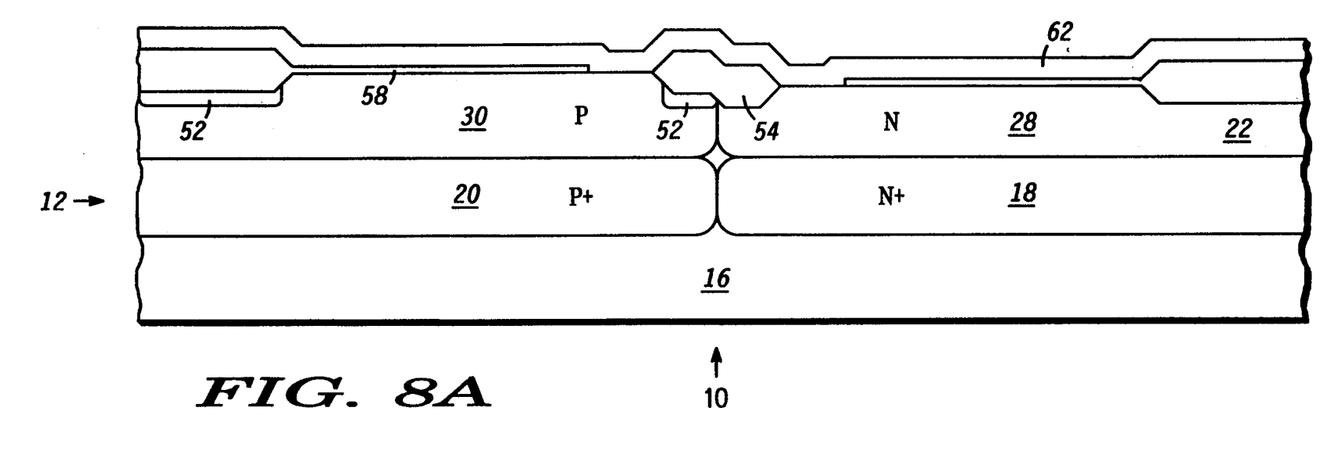
Figure 8B:
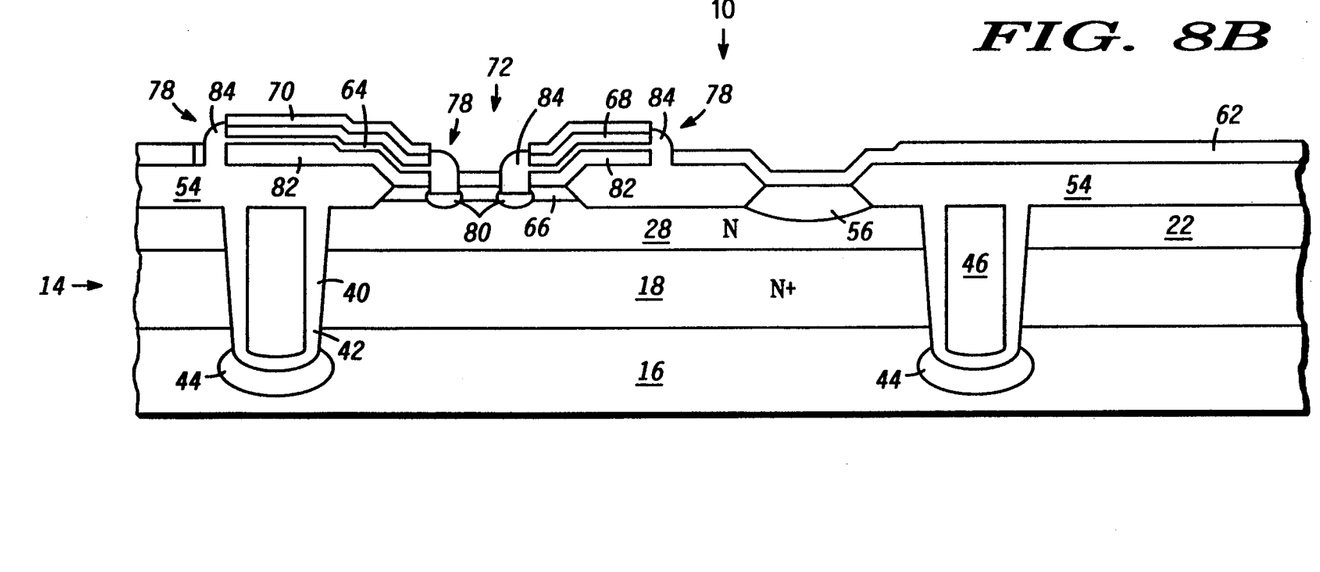

Now referring specifically to FIGS. 8A and 8B. Following the formation of lens oxide layer 76, nitride spacers 74 are removed leaving the portions of first electrode polysilicon layer 62 disposed therebeneath exposed. These exposed portions of first electrode polysilicon layer 62 are then etched away to form slots 78 where nitride spacer 74 were formally disposed. Slots 78 not disposed inside window 72 extend to field oxide regions 54 while slots 78 disposed within window 72 may extend into the silicon of active base region 66. Following the formation of slots 78, a screen oxide layer (not shown) is formed on the surface of MOS portion 12 and bipolar portion 14.

Link base regions 80 are formed beneath slots 78 in window 72 following the formation of the screen oxide layer. Link base regions 80 are formed by implanting a P type dopant such as boron or boron difluoride through slots 78 disposed in window 72. Link base regions 80 serve to link active base region 66 to extrinsic base contacts 82. Link base regions 80 have a dopant concentration on the order of $10^{18}$ atoms/cc. Although link base regions 80 are implanted herein, it should be understood that they may be formed by other methods well known in the art. Following the formation of link base regions 80, oxide spacers 84 are formed in slots 78. Oxide spacers 84 are fabricated by forming an oxide layer on the screen oxide layer and then etching the entire oxide layer and screen oxide layer excepting oxide spacers 84. It should be understood that a densification anneal to densify the oxide layer may be performed prior to etching oxide spacers 84 from the oxide layer and the screen oxide layer.

Figure 9A:
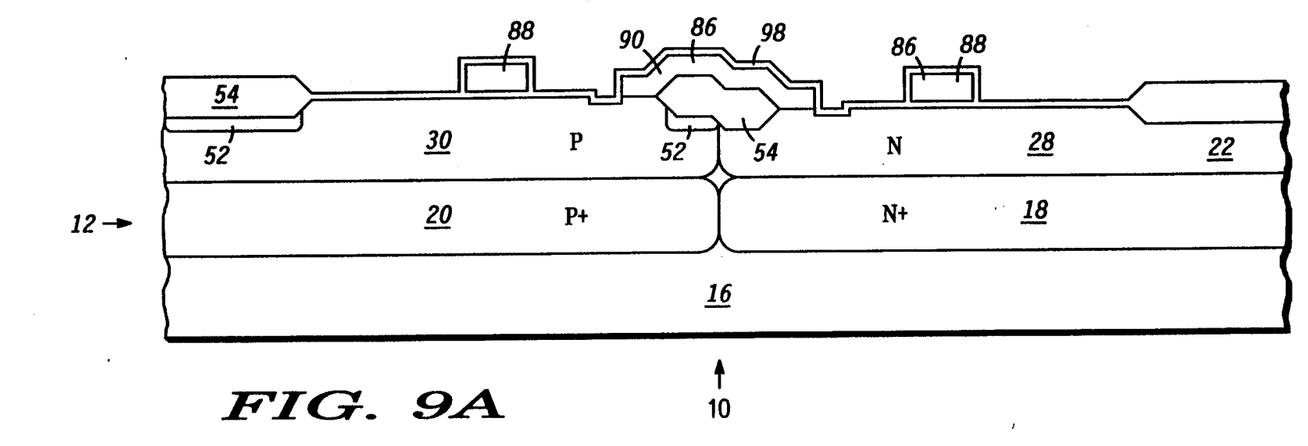
Figure 9B:
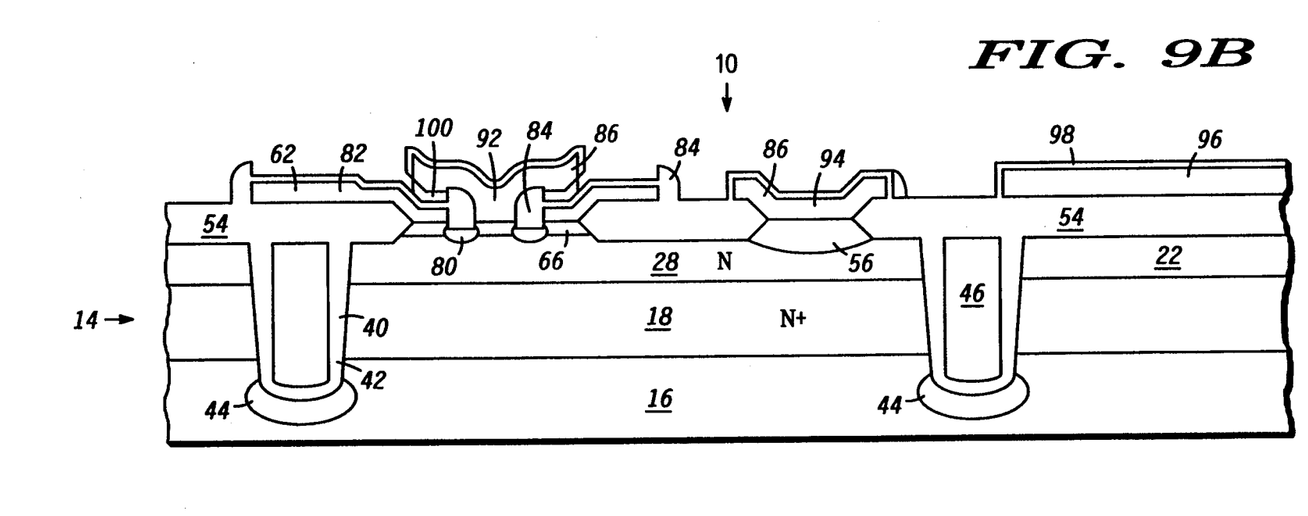

Now referring specifically to FIGS. 9A and 9B. A second electrode polysilicon layer 86 is formed conformally over MOS portion 12 and bipolar portion 14.

Second electrode polysilicon layer 86 is formed directly on first electrode polysilicon layer 62 except where the portions of screen oxide layer 64, nitride layer 68 and polysilicon layer 70 remain at the time of the deposition of second electrode polysilicon layer 86 (see earlier FIGS.). Second electrode polysilicon layer 86 is preferably undoped at deposition and has a thickness on the order of 1200 angstroms.

Following the deposition of second electrode polysilicon layer 86, second electrode polysilicon layer 86 and first electrode polysilicon layer 62 are patterned and etched. Gate electrodes 88 and buried contact electrode 90 are formed on MOS portion 12. Emitter electrode 92 and collector electrode 94 are formed on bipolar portion 14. Gate electrodes 88, buried contact electrode 90, emitter electrode 92 and collector electrode 94 are each comprised of portions of first electrode polysilicon layer 62 and second electrode polysilicon layer 86.

Patterned and etched simultaneously with electrodes 88, 90, 92 and 94 is polysilicon resistor body 96 disposed on field oxide region 54 of bipolar portion 14. Resistor body 96 also comprises portions of first electrode polysilicon layer 62 and second electrode polysilicon layer 86. Resistor body 96 will be explained in more detail presently. Additionally, the etching of first and second electrode polysilicon layers 62 and 86 simultaneously removes the remaining portions of polysilicon layer 70 and exposes the remaining portions of nitride layer 68.

Following the patterning and etching of first and second electrode polysilicon layers 62 and 86, a protective oxide layer 98 is formed on the exposed silicon regions of MOS portion 12 and bipolar portion 14. Although protective oxide layer 98 is thermally grown herein, it should be understood that it may be deposited. Protective oxide layer 98 has a thickness on the order of 100 angstroms.

Emitter electrode 92 and collector electrode 94 are doped. Doping of electrodes 92 and 94 may occur either before or after the formation of protective oxide layer 98. Arsenic or a similar N type dopant is implanted into electrodes 92 and 94 to obtain a dopant concentration on the order of $10^{20}$ atoms/cc. Following the implantation of electrodes 92 and 94, the remaining exposed potions of nitride layer 68 (see earlier FIGS.) are removed leaving only nitride portions 100 disposed beneath the lateral extensions of emitter electrode 92 and abutting oxide spacers 84.

Figure 10A:
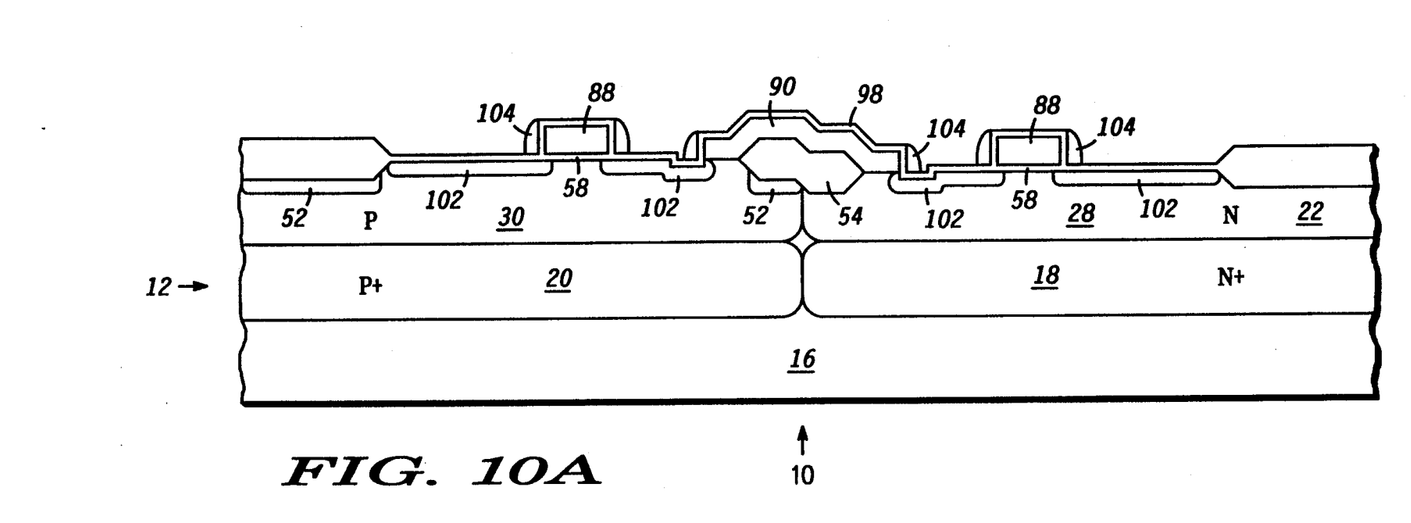
Figure 10B:
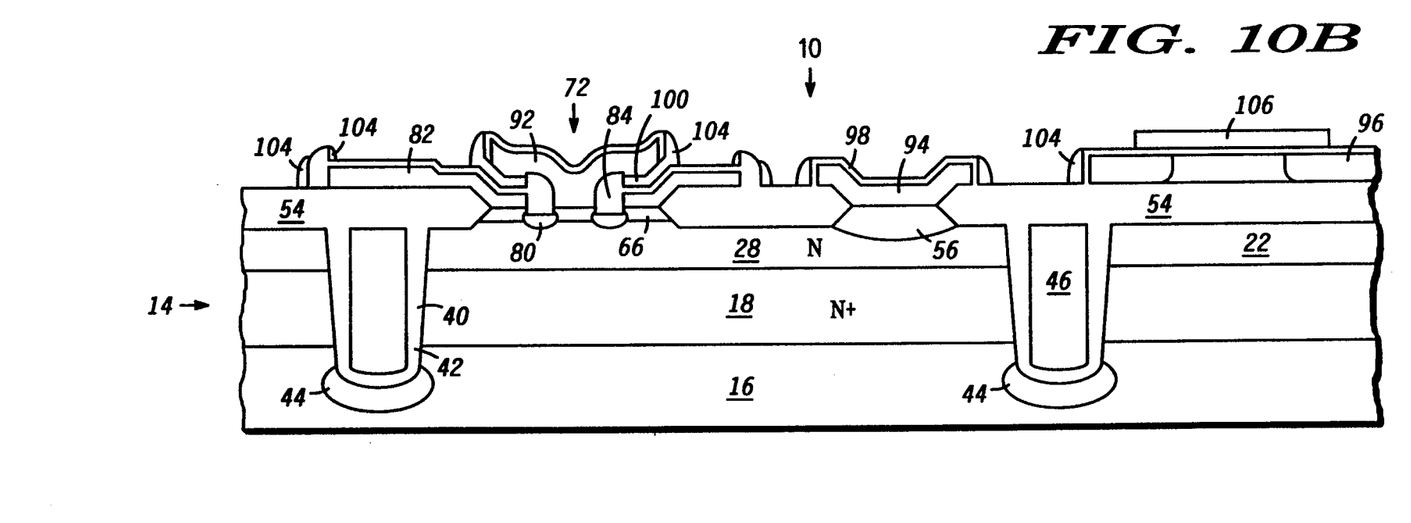

Now referring specifically to FIGS. 10A and 10B. Lightly doped drain regions 102 are formed by implanting dopant into N well 28 and P well 30 of MOS portion 12. Lightly doped drain regions 102 are formed in P well 30 by implanting an N type dopant such as phosphorous and lightly doped drain regions are formed in N well 28 by implanting a P type dopant such as boron. The implants are self aligned to gate electrodes 88. Lightly doped drain regions 102 have a surface dopant concentration on the order of $10^{18}$ atoms/cc.

Simultaneous with the formation of lightly doped drain regions 102, gate electrodes 88 and buried contact electrode 90 are also doped. Gate electrode 88 and the portion of buried contact electrode 90 disposed over P well 30 are doped N type while gate electrode 88 and the portion of buried contact electrode 90 disposed over N well 28 are doped P type.

After forming lightly doped drain regions 102 and doping electrodes 88 and 90, polysilicon resistor body 96 is doped. In a preferred embodiment, boron is implanted into resistor body 96 to obtain a preferred resistivity on the order of 2 kohms/square. It should be understood that resistor body 96 may be doped according to specific applications. Following the initial doping of resistor body 96, additional dopant may be implanted into the end portions of resistor body 96. This end enhancement allows for better contacts to resistor body 96 and also allows for the fabrication of lower value resistors. During the end enhancement doping of resistor body 96 it may also be desirable to implant additional dopant (boron) into extrinsic base electrode 82. It should be understood that this may improve base electrode 82.

Nitride spacers 104 are formed on MOS portion 12 and bipolar portion 14. On MOS portion 12, nitride spacers 104 abutt the sides of each gate electrode 88 and also the sides of buried contact electrode 90. On bipolar portion 14, nitride spacers 104 abutt resistor body 96, the sides of collector electrode 94 and those oxide spacers 84 not disposed in window 72. Nitride spacers 104 also abutt the sides of emitter electrode 92. The nitride spacers 104 which abutt emitter electrode 92 are coupled to nitride portions 100. Nitride spacers 104 are formed by forming a conformal nitride layer over the surface of MOS portion 12 and bipolar portion 14 and then etching away the unwanted portions of the conformal nitride layer to form nitride spacers 104. Simultaneous with the formation of nitride spacers 104 is the formation of nitride resistor cap 106. Nitride resistor cap 106 is also formed from the conformal nitride layer used to form nitride spacers 104. Although spacers 104 comprise nitride herein, it should be understood that other dielectric materials may be substituted.

Figure 11A:
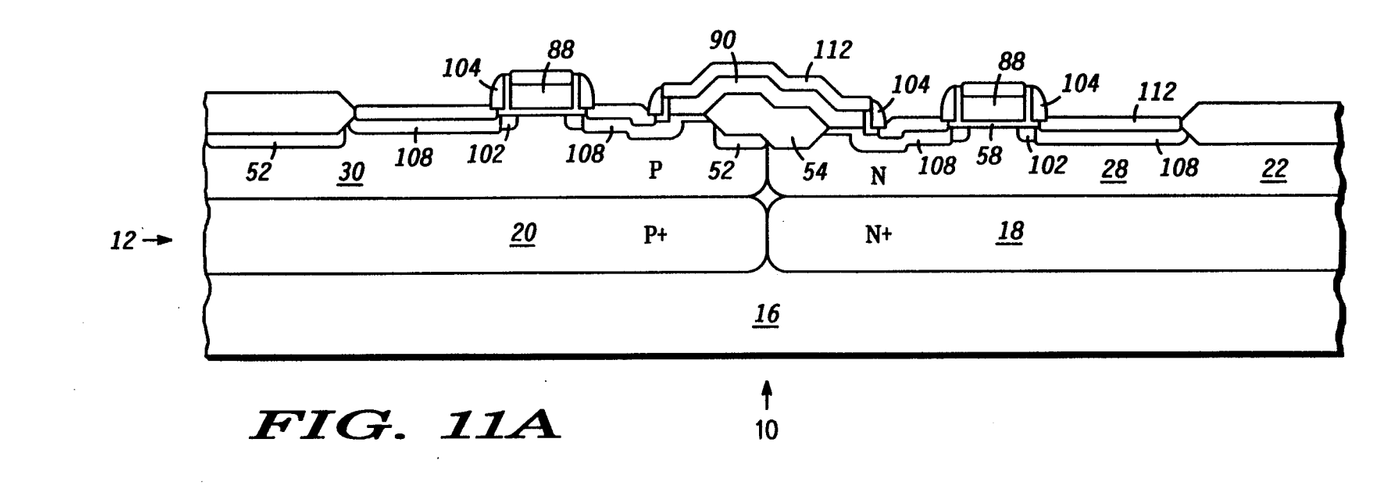
Figure 11B:
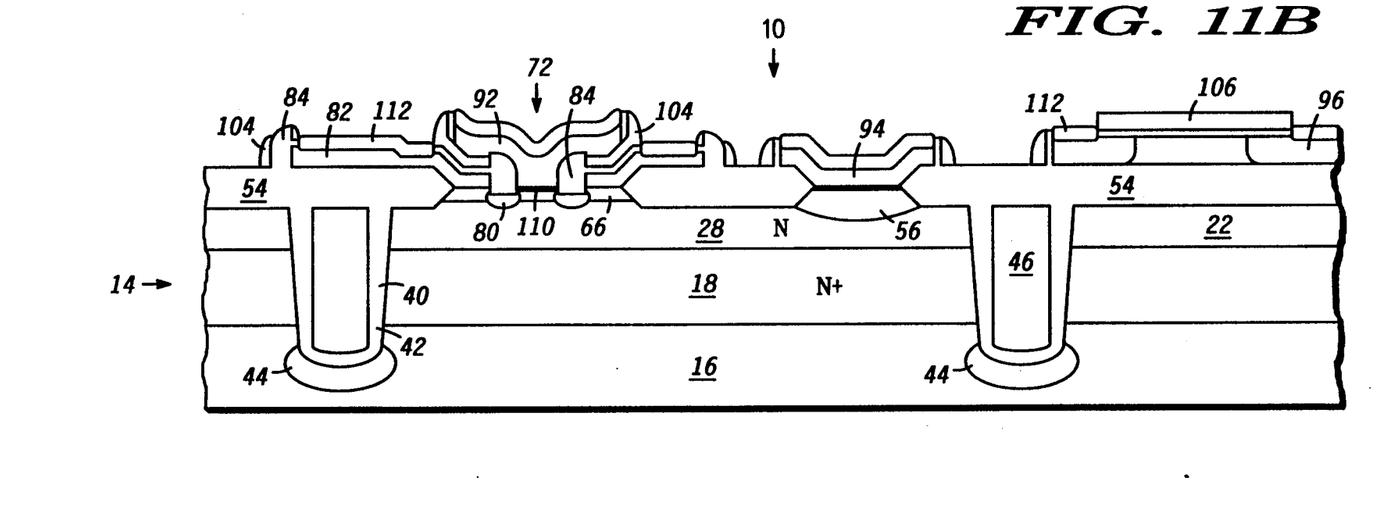

FIG. 11 is a highly enlarged cross-sectional view of BICMOS structure 10 in accordance with the present invention wherein FIG. 11A represents MOS portion 12 of structure 10 and FIG. 11B represents bipolar portion 14. Source and drain regions 108 are implanted into N well 28 and P well 30 of MOS portion 12. Source and drain regions 108 are formed in N well 28 by implanting a P type dopant such as boron while source and drain regions are formed in P well 30 by implanting an N type dopant such as arsenic. Source and drain regions 108 should have a surface dopant concentration of at least $10^{20}$ atoms/cc. During the implantation of source and drain regions 108 into N well 28, additional P type dopant (boron) may be implanted into extrinsic base electrode 82. This may enhance performance of the extrinsic base. Gate electrodes 88 and buried contact electrode 90 are further doped during the formation of source and drain regions 108.

Following the formation of source and drain regions 108, BICMOS structure 10 is annealed. Preferably a rapid thermal anneal is employed. During the anneal, source and drain regions 108 are properly diffused and emitter region 110 is diffused from emitter electrode 92 between link base regions 80. Also during this anneal, additional dopant is diffused from extrinsic base electrode 82 into active base 66. Following anneal, protective oxide layer 98 is removed from the surface of MOS portion 12 and bipolar portion 14 of BICMOS structure 10.

Once oxide layer 98 is removed, silicide 112 is formed on the exposed electrodes of BICMOS structure 10. Although virtually any silicide may be formed, titanium disilicide is employed herein. Titanium disilicide 112 are formed by depositing a titanium layer on MOS portion 12 and bipolar portion 14. BICMOS structure 10 is then annealed so that the deposited titanium reacts with the exposed silicon to form titanium disilicide. Following the anneal, non-silicided portions of the deposited titanium are etched away and BICMOS structure 10 is annealed for second time. As shown, titanium disilicide 112 is formed on gate electrodes 88, buried contact electrode 90 and source and drain regions 108 of MOS portion 12. Additionally, titanium disilicide 112 is formed on extrinsic base electrode 82, emitter electrode 92, collector electrode 94 and the enhanced ends of resistor body 96 of bipolar portion 14.

Following the formation of silicide 112, an interlayer dielectric such as oxide may be formed on the surface of BICMOS structure 10 and multilayer metallization may be employed.

The method of fabricating a semiconductor structure having both MOS and bipolar devices shown herein employs split polysilicon electrodes wherein gate electrodes 88, buried electrode 90, emitter electrode 92, collector electrode 94 and resistor body 96 are formed from two distinct and separately deposited layers of polysilicon. This allows for an extremely high performance BICMOS technology wherein a high performance bipolar device is combined with advanced CMOS. A CMOS-only flow may be easily derived from the BICMOS flow described herein with only minimal changes in the CMOS device characteristics.

Thus is it apparent that there has been provided, in accordance with the invention a method of fabricating a semiconductor structure having MOS and bipolar devices. While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

What is claimed:

1. A method of fabricating a semiconductor structure having MOS and bipolar devices comprising the steps of:
    providing an isolation structure having MOS and bipolar active areas including doped wells;
    forming a collector region in said bipolar active area forming a first semiconductor layer over said MOS and bipolar active areas;
    forming an active base region in said bipolar active area well;
    forming a dielectric layer on said first semiconductor layer over a portion of said bipolar active area and forming a window in said dielectric layer extending to said first semiconductor layer;
    forming a second semiconductor layer over said MOS and bipolar active areas;
    forming a gate electrode on said MOS active area and emitter and collector electrodes on said bipolar active area, said gate, emitter and collector electrodes being formed from said first and second semiconductor layers and said emitter electrode extending into said window;
    doping said emitter and collector electrodes;
    forming self-aligned source and drain regions in said MOS active area; and
    diffusing an emitter region into said bipolar active area well from said emitter electrode through said window.

2. The method of claim 1 further including the step of forming dielectric spacers in the window.

3. The method of claim 2 further including the steps of forming an oxide lens in the window between the dielectric spacers, removing said dielectric spacers, and forming slots extending through the first semiconductor layer in said window where said dielectric spacers were formerly disposed.

4. The method of claim 3 further including the step of forming link base regions through the slots in the bipolar active area which link the active base to an extrinsic base.

5. The method of claim 4 further including the step of forming an extrinsic base in the bipolar active area.

6. The method of claim 1 further including the step of forming silicide on the gate, emitter and collector electrodes and on the source and drain regions.

7. A method of fabricating a semiconductor structure having complementary MOS and bipolar devices comprising the steps of:
    providing an isolation structure having a complementary MOS active area including a P doped well and an N doped well and a bipolar active area including a doped well;
    forming a collector region in said bipolar active area well;
    forming a first silicon layer over said MOS and bipolar active areas;
    forming an active base region in said bipolar active area well;
    forming a dielectric layer on said first silicon layer over a portion of said bipolar active area and forming a window in said dielectric layer extending to said first silicon layer;
    forming dielectric spacers in said window and forming an oxide lens between said spacers;
    removing said spacers and forming slots extending through said first silicon layer in said window where said dielectric spacers were formerly disposed;
    forming link base regions in said bipolar active area well through said slots;
    filling said slots with a dielectric material;
    forming a second silicon layer over said MOS and bipolar active areas;
    forming gate electrodes on said P doped well and said N doped well of said MOS active area and emitter and collector electrodes on said bipolar active area well, said gate, emitter and collector electrodes being formed from said first and second silicon layers and wherein said emitter electrode extends into said window;
    doping said emitter and collector electrodes;
    forming self-aligned N type source and drain regions in said P doped well of said MOS active area and self-aligned P type source and drain regions in said N doped well of said MOS active area;
    forming an extrinsic base region in said bipolar active area; and
    diffusing an emitter region into said bipolar active area well from said emitter electrode through said window.

8. The method of claim 7 further including the step of forming silicide on the gate, emitter and collector electrodes and on the source and drain regions.

9. The method of claim 7 further including the step of forming a resistive region on the structure, said resistive region being formed from the first and second silicon layers.

10. The method of claim 9 further including the step of doping the resistive region at least one end to have a lesser resistivity than a central portion of said resistive region.

11. The method of claim 10 further including the step of forming silicide on the at least one end having a lesser resistivity than the central portion.

12. The method of claim 9 further including the step of forming the resistive region adjacent the bipolar active area.

13. A method of fabricating a BICMOS structure having a resistive region comprising the steps of:
providing an isolation structure having a complementary MOS active area including a P well and an N well, a bipolar active area having a doped well and a resistor area;
implanting a collector region into said doped well of said bipolar active area;
forming a first polysilicon layer over said MOS and bipolar active areas and said resistor area;
forming an active base region in said doped well of said bipolar active area;
forming a dielectric layer on said first polysilicon layer over a portion of said bipolar active area and forming a widow in said dielectric layer that extends to said first polysilicon layer;
forming first dielectric spacers in said window abutting sidewalls of said window and forming an oxide lens on said first polysilicon layer between said first spacers;
removing said first spacers and forming slots through said first polysilicon layer in said window where said first spacers were formerly disposed;
implanting link base regions in said bipolar active area through said slots;
forming second dielectric spacers in said slots;
forming a second polysilicon layer over said MOS and bipolar active areas and said resistor area;
forming gate electrodes on said P well and said N well of said MOS active area and emitter and collector electrodes on said bipolar active area, said gate, emitter and collector electrodes being formed from said first and second polysilicon layers and wherein said emitter electrode extends into said window;
doping said emitter and collector electrodes;
doping the portions of said first and second polysilicon layers disposed over said resistor area to form a resistive region;
doping at least one end of said resistive region to have a lesser resistivity than a central portion of said resistive region;
doping at least portions of the first polysilicon layer adjacent said emitter contact to form a base electrode;
implanting P type source and drain regions in said N well and N type source and drain regions in said P well; and
diffusing an emitter region into said bipolar active area well from said emitter electrode through said window.

14. The method of claim 13 further including the step of forming silicide on the gate, emitter and collector electrodes, the at least one end of the resistive region, the source and drain regions and the portions of said first polysilicon layer adjacent said emitter electrode.

15. The method of claim 13 further including the step of forming the resistive region adjacent the bipolar active area.

* * * * *

UNITED STATES PATENT AND TRADEMARK OFFICE
CERTIFICATE OF CORRECTION

PATENT NO. : 5,134,082

DATED : July 28, 1992

INVENTOR(S) : James A. Kirchgessner

It is certified that error appears in the above-identified patent and that said Letters Patent is hereby corrected as shown below:

Column 9, claim 1, line 46, after "area" insert --well;--.

Column 11, claim 13, line 29, change "widow" to --window--.

Signed and Sealed this

Twenty-sixth Day of July, 1994

Attest:

BRUCE LEHMAN

Attesting Officer

Commissioner of Patents and Trademarks